(12) United States Patent
Schaefer

(10) Patent No.: US 8,749,246 B2
(45) Date of Patent: Jun. 10, 2014

(54) METHOD AND DEVICE FOR DETERMINING A MAXIMUM LEAKAGE CURRENT

(75) Inventor: Oliver Schaefer, Gruenberg-Harbach (DE)

(73) Assignee: Bender GmbH & Co. KG, Gruenberg (DE)

( * ) Notice: Subject to any disclaimer, the term of this patent is extended or adjusted under 35 U.S.C. 154(b) by 485 days.

(21) Appl. No.: 13/028,798

(22) Filed: Feb. 16, 2011

(65) Prior Publication Data

US 2012/0206148 A1    Aug. 16, 2012

(51) Int. Cl.
*G01R 27/18* (2006.01)
(52) U.S. Cl.
USPC ............ 324/509; 324/510; 324/324; 324/522
(58) Field of Classification Search
USPC .................. 324/426, 509, 536, 551, 659, 664; 361/42, 87
See application file for complete search history.

(56) References Cited

U.S. PATENT DOCUMENTS

| | | | | |
|---|---|---|---|---|
| 4,206,398 A | * | 6/1980 | Janning | 324/509 |
| 4,472,676 A | * | 9/1984 | Eichmann et al. | 324/509 |
| 4,896,115 A | * | 1/1990 | LeMaitre et al. | 324/551 |
| 5,450,328 A | * | 9/1995 | Janke et al. | 702/65 |
| 6,556,397 B2 | * | 4/2003 | Kim et al. | 361/42 |
| 2008/0100305 A1 | * | 5/2008 | Gass et al. | 324/536 |
| 2010/0259276 A1 | * | 10/2010 | Streit | 324/525 |
| 2012/0119918 A1 | * | 5/2012 | Williams | 340/664 |

* cited by examiner

*Primary Examiner* — Arleen M Vazquez
*Assistant Examiner* — Brent J Andrews
(74) *Attorney, Agent, or Firm* — Griffin & Szipl, P.C.

(57) ABSTRACT

The invention relates to a method and a device for determining a maximum leakage current in unearthed power supply networks with a plurality of conductors. The method comprises the steps of: feeding of a measurement signal $U_P$ with a measurement frequency $f_{Puls}$ into a conductor arrangement, setting the measurement frequency $f_{Puls}$, measuring a line-to-line voltage $U_{L-E}$ for each conductor, determining a maximum occurring line-to-line voltage $U_{L-Emax}$ from the measured line-to-line voltages $U_{L-E}$, determining a voltage $U_{Ze}$ across a measurement resistance $R_M$ for calculating a leakage impedance $Z_E$, calculating the leakage impedance $Z_E$, and calculating a maximum leakage current THC. The device comprises a signal generator for feeding in the $U_P$ with the $f_{Puls}$, a network coupling circuit between the signal generator and the conductor arrangement, a voltage measuring circuit for measuring the $U_{L-E}$, and an impedance measuring circuit for determining the $Z_e$ by means of the determining of the $U_{Ze}$.

13 Claims, 5 Drawing Sheets

METHOD AND DEVICE FOR DETERMINING A MAXIMUM LEAKAGE CURRENT

FIELD OF THE INVENTION

The invention relates to a method for determining a maximum leakage current in unearthed power supply networks with a plurality of live conductors.

Furthermore, the invention relates to a device for determining a maximum leakage current in unearthed power supply networks with a plurality of live conductors.

BACKGROUND OF THE INVENTION

When designing a power supply system, in addition to the performance of the power network, operational and personal safety must be ensured. A protective concept for a faultless operation therefore comprises protective measures which ensure continuous power supply with simultaneous personal and plant protection.

Unearthed mains have proven themselves with regards to operational safety and the minimisation of the risk of unavailability of the power supply. In unearthed mains, there are no active conductors directly connected to earth potential, so that in the event of a (unipolar) earth fault, in the absence of a return wire, a short circuit current, which triggers a fuse and leads to an interruption of operation, cannot flow as it can in earthed systems. An unearthed network can be operated further safely in spite of this earth fault.

Completely insulated, unearthed mains furthermore offer the best possible protection for people, in case they should touch a live conductor, as due to the ideally infinitely large impedance value between conductor and earth, no closed circuit with a current flowing via the (earthed) person can result.

In practice, however, the mains have finite ohmic and capacitive resistances—a complex-valued network leakage impedance—with respect to earth, so that in the event that a conductor becomes connected to earth potential by means of touching an (earthed) person, a closed circuit results via this network leakage impedance and the human body, in which closed circuit potentially lethal leakage currents can flow. The leakage current is principally defined by the capacitance formed by the conductor arrangement and earth and thus has a predominantly capacitive component.

Particularly in hospitals with their multiplicity of medical electrical devices, people come into direct contact with live parts, in that for example the patient is connected via electrodes or probes to a device of this type during an examination or during an operative intervention. An additional current flow, which is brought about unintentionally, could impair the action of the medical measure and, in the worst case scenario, have fatal consequences for the patient. It is for this reason that unearthed mains in hospitals are subject to particular regulations which require a constant checking of the maximum leakage current THC (total hazard current). A monitoring device of this type is also designated as a line isolation monitor (LIM).

In this case, the current which would flow in the event that a person touches a live conductor is designated as the maximum leakage current. In accordance with the definition, this current arises from the division of the maximum occurring voltage between conductor and earth (network voltage $U_{LE,max}$) and network leakage impedance ($Z_E$): $THC = U_{LE,max}/Z_E$.

The two values $U_{LE,max}$ and $Z_E$ required for determining the maximum leakage current can be determined independently of one another. Whilst the determination of the network voltage for the most part results from a conventional voltage measurement by means of a resistor network and does not place any great demands on measurement technology, the determination of the complex-valued network impedance $Z_E$ shapes up to be complex, as a suitable test or measurement signal for impedance measurement has a small amplitude and is overlaid by the network voltage and further interference pulses during the continuous monitoring of a conductor system. A fundamental problem therefore consists in the separation of the measurement signal from the line-to-line voltage, whereby the selection of a suitable frequency of the measurement signal can make a decisive contribution to a reliable determination of the network leakage impedance and therefore of the leakage current.

A method is known from the published document U.S. Pat. No. 4,206,398, in which, for determining the leakage current, a measurement signal is impressed into the mains, which, although it has the network frequency, is additionally phase-modulated. Due to the continuous phase modulation of the measurement signal, this can be separated as a non-stationary signal portion from the total voltage by means of the filtering of the useful portion (network voltage). In a closed-loop control circuit, this test voltage is used as a control variable, it being possible to set the impressed current in such a manner that the test voltage corresponds to the network voltage. The stationary end value of the current then corresponds to the leakage current to be determined.

In the digital line isolation monitor (LIM) described in the published document U.S. Pat. No. 5,450,328, a sinusoidal measurement current is impressed into the mains for determining the leakage impedance, its value of the network frequency can be calculated with known modelling of the leakage impedance. After filtering out and measuring the test voltage, which falls as a consequence of the measurement current across the leakage impedance, the value of the leakage impedance can be calculated for the network voltage with known modelling of the leakage impedance.

In the published document U.S. Pat. No. 4,472,676, a system for measuring the leakage impedance is disclosed, in which the test signal fed into the conductor network only has a small frequency deviation from the network frequency. By evaluating the interference pattern of the total voltage resulting by means of the overlaying of test voltage and network voltage, it is possible in the case of known impressed measurement current to measure a voltage drop proportional to the leakage impedance.

The previously mentioned solution approaches show various ways in which the measurement signal in the frequency spectrum can be extracted from the aggregate signal. By means of a phase modulation of a test signal with the same frequency as the network, by means of a test signal of clearly deviating frequency with the option of setting the frequency manually or by means of a test signal with only small frequency deviation and subsequent evaluation of the interference signal.

Common to all three solution approaches is the fact that the frequency of the measurement signal is always constant. As, however, in the practical operation of a conductor network, interference signals, which lie in the frequency range of these fixed measurement frequencies, can also arise to a greater extent during the measurement, inaccurate determinations of the maximum leakage current and thus, in the case of the monitoring of a conductor network, the triggering of false alarms can occur. By way of example for this, mention may be made of the generation of interference frequencies remote from the network frequency by means of the increasing use of frequency converters in the hospital sector or the mutual influence on the network frequency by means of two unearthed mains installed in parallel.

SUMMARY OF THE INVENTION

The present invention is therefore based on the object of developing a method and also a device for determining the maximum leakage current, which increases the reliability in the case of the determination of the leakage current and thus decreases the frequency of the triggering of false alarms in the case of the monitoring of unearthed power supply networks.

This object according to the invention is achieved with the characteristics of a method for determining a maximum leakage current in unearthed power supply networks (2) with a plurality of live conductors (L1, L2) in that the method comprises the method steps: —feeding of a measurement signal $U_P$ with a measurement frequency $f_{Puls}$ into the conductor arrangement (2, 10), —setting the measurement frequency $f_{Puls}$ (54), —measuring a line-to-line voltage $U_{L-E}$ for each conductor (L1, L2, 56), —determining a maximum occurring line-to-line voltage $U_{L-Emax}$ from the measured line-to-line voltages $U_{L-E}$ (56), —determining a voltage $U_{Ze}$ across a measurement resistance $R_M$ for calculating the leakage impedance $Z_E$ (62), —calculating a leakage impedance $Z_E$ (66), —calculating a maximum leakage current THC (68), —repeating the previous steps, characterised in that the measurement frequency $f_{Puls}$ can be changed during the measurement and the setting of the measurement frequency $f_{Puls}$ takes place automatically by means of an interference frequency analysis (54). Additional, particularly beneficial, embodiments of the invention are provided in accordance with the following subsidiary methods for determining a maximum leakage current in unearthed power supply networks (2) with a plurality of live conductors (L1, L2).

In accordance with a second method of determining a maximum leakage current embodiment of the invention, the first embodiment is modified so that the interference frequency analysis (54) comprises the following automatically running method steps: —setting of the measurement signal value $U_P=0$ volt (70), —setting of a centre frequency $f_{G\_BP}$ of a band-pass filter (30) to a lower threshold frequency $f_{Puls\_min}$ of a measurement range of a signal generator (10, 70), —determination of the absolute value $|U_{Ze}|$ of the voltage $U_{Ze}$ across the measurement resistance $R_M$ (72), —storing the absolute value $|U_{Ze}|$ and the associated frequency $f_{G\_BP}$ set (74), —repetition of the determination of the absolute value $|U_{Ze}|$ of the voltage $U_{Ze}$ with step-by-step increasing of the centre frequency $f_{G\_BP}$ of the band-pass filter (30), until $f_{G\_BP}$ corresponds to an upper threshold frequency $f_{Puls\_max}$ of the measurement range of the signal generator (10) (76, 78), —determination of the smallest measurement value $|U_{Ze}|$ min from the voltages recorded $|U_{Ze}|$ and determination of the associated centre frequency $f_{G\_BP}$ (80), —setting of the measurement frequency $f_{Puls}$ to the value $f_{G\_BP}$ belonging to the measurement value $|U_{Ze}|$ min (82) and setting the measurement signal value to $U_P>0$ volt. In accordance with a third method of determining a maximum leakage current embodiment of the invention, the first embodiment or the second embodiment is modified so that differential voltages $U_{Lnm}$ between the conductor pairs n, m are determined (56) from the measurement of the line-to-line voltages $U_{L-E}$ (56), following that, the respective spectral components of these differential voltages $U_{Lnm}$ at the point $f_{Puls}$ are calculated (58) and the method is continued with a return jump to setting the measurement frequency $f_{Puls}$ (54), in the event that $|U_{Lnm}|(f_{Puls})>0$ is true for one of the differential voltages (60). In accordance with a fourth method of determining a maximum leakage current embodiment of the invention, the first embodiment, the second embodiment, or the third embodiment of the invention is modified so that after the determining of the voltage $U_{Ze}$ (62), a threshold value query $U_{Ze}<U_{Ze\_max}$ is carried out (64), wherein $U_{Ze\_max}$ corresponds to a measurement range threshold value of the signal generator (10) and the method is continued with a return jump to setting the measurement frequency $f_{Puls}$ (54), in the event that $U^{Ze}>U_{Ze\_max}$. In accordance of a fifth method of determining a maximum leakage current embodiment of the invention, the first embodiment, the second embodiment, the third embodiment, or the fourth embodiment is modified so that the determining of the voltage $U_{Ze}$ (62) takes place across the measurement resistance $R_M$ with applied measurement voltage $U_P$ by means of the measurement of the line-to-line voltages $U_{L-E}$ (14, 56), addition of the measured line-to-line voltages $U_{L-E}$ (28) and subsequent band-pass filtering (30) of the aggregate signal for obtaining a voltage component giving the voltage $U_{Ze}$ at the frequency $f_{Puls}$. In accordance of a sixth method of determining a maximum leakage current embodiment of the invention, the second embodiment, the third embodiment, the fourth embodiment, or the fifth embodiment is modified so that the centre frequency $f_{G\_BP}$ of the band-pass filter (30) for filtering out the voltage $U_{Ze}$ is automatically set to the measurement frequency $f_{Puls}$ of the signal generator (10) (36). In accordance with a seventh method of determining a maximum leakage current embodiment of the invention, the first embodiment, the second embodiment, the third embodiment, the fourth embodiment, the fifth embodiment, or the sixth embodiment is modified so that the calculation of the leakage impedance $Z_E$ takes place in accordance with the relationship $Z_E=(U_P*R_M)/U_{ZE}-(R_M+R_A)$ (66). In accordance with a eighth method of determining a maximum leakage current embodiment of the invention, the first embodiment, the second embodiment, the third embodiment, the fourth embodiment, the fifth embodiment, the sixth embodiment, or the seventh embodiment is modified so that the determination of the maximum leakage current THC takes place in accordance with the formula $THC=U_{L-Emax}/Z_{E0}$, wherein $Z_{E0}$ is the leakage impedance at the network frequency, which arises in a frequency-corrected manner from the value $Z_E$ calculated at the measurement frequency $f_{Puls}$ (68). In accordance with a ninth method of determining a maximum leakage current embodiment of the invention, the first embodiment, the second embodiment, the third embodiment, the fourth embodiment, the fifth embodiment, the sixth embodiment, the seventh embodiment, or the eighth embodiment is modified so that an initialisation (50) is carried out at the start of the method. In accordance with a tenth method of determining a maximum leakage current embodiment of the invention, the first embodiment, the second embodiment, the third embodiment, the fourth embodiment, the fifth embodiment, the sixth embodiment, the seventh embodiment, the eighth embodiment, or the ninth embodiment is modified so that a self test (52) is carried out at the start of the method. In accordance with a eleventh method of determining a maximum leakage current embodiment of the invention, the first embodiment, the second embodiment, the third embodiment, the fourth embodiment, the fifth embodiment, the sixth embodiment, the seventh embodiment, the eighth embodiment, the ninth embodiment, or the tenth embodiment is modified so that after the initialisation (50) a timer is started (52) and the method begins again with a self test (52), in the case that the timer has run out or the measurement of the line-to-line voltages is constantly continued in the case of a timer which has not run out (69). In accordance with a twelfth method of determining a maximum leakage current embodiment of the invention, the first embodiment, the second embodiment, the third embodiment, the fourth embodiment, the fifth embodiment, the sixth embodiment, the seventh embodiment, the eighth embodiment, the ninth embodiment, the tenth embodiment, or the eleventh embodiment is modified so that the measurement signal $U_P$ is generated with a signal generator (10) from a rectangular signal characteristic.

The method according to the invention therefore has the advantage compared to the prior art of taking account of interference pulses arising in the mains during the determination of the leakage impedance and diverting to other interference-free measurement frequencies. In this case, the determination of a suitable substantially interference-free measurement frequency takes place without manual interventions by means of an interference frequency analysis initiated and executed in the method automatically. The measurement voltages drawn on for determining the maximum leakage current are therefore incorporated into the calculations in an undistorted manner and lead to a reliable value of the leakage current. The risk of false warnings due to an imprecise determination of the leakage current is reduced considerably. By means of the automatic setting of the measurement frequency, it is furthermore possible to operate a plurality of monitoring devices (LIMs) in unearthed networks which are managed in parallel or even to operate a plurality of monitoring devices in the same network in a safety redundant manner.

By means of the automatically running interference frequency analysis, a value is determined for the measurement frequency $f_{Puls}$, for which the interference amplitudes are minimal. In an advantageous manner, the interference frequency analysis comprises the following method steps: setting of the measurement signal value $U_P=0$ volt, setting of a centre frequency $f_{G\_BP}$ of a band-pass filter to a lower threshold frequency $f_{Puls\_min}$ of a measurement range of a signal generator, determination of the absolute value $|U_{Ze}|$ of the voltage $U_{Ze}$ across the measurement resistance $R_M$, storing the absolute value $|U_{Ze}|$ and the associated frequency $f_{G\_BP}$ set, repetition of the determination of the absolute value $|U_{Ze}|$ of the voltage $U_{Ze}$ with step-by-step increasing of the centre frequency $f_{G\_BP}$ of the band-pass filter, until $f_{G\_BP}$ corresponds to an upper threshold frequency $f_{Puls\_max}$ of the measurement range of the signal generator, determination of the smallest measurement value $|U_{Ze}|$ min from the voltages recorded $|U_{Ze}|$ and determination of the associated centre frequency $f_{G\_BP}$, setting of the measurement frequency $f_{Puls}$ to the value $f_{G\_BP}$ belonging to the measurement value $|U_{Ze}|$ min and setting the measurement signal value to $U_P>0$ volt.

In the case of deactivated measurement voltage $U_P$, a search is made in the settable frequency range of the signal generator in the pass-range of a band-pass filter with tunable centre frequency $f_{G\_BP}$ for interference components and the measurement frequency $f_{Puls}$ at which the smallest interference amplitudes arose is subsequently selected.

In a further advantageous configuration, differential voltages $U_{Lnm}$ between the conductor pairs n, m are initially determined from the measurement of the line-to-line voltages $U_{L-E}$, following that, the respective spectral components of these differential voltages $U_{Lnm}$ at the point $f_{Puls}$ are calculated and the method is continued with a return jump to setting the measurement frequency $f_{Puls}$, in the event that $|U_{Lnm}|$ $(f_{Puls})>0$ is true for one of the differential voltages.

During the measurement of the leakage impedance, an interference component, which is caused by a connected consumer, can be detected for the measurement frequency $f_{Puls}$ by means of this evaluation of the differential voltages $U_{Lnm}$. In cases in which an interference amplitude has been detected at the place of the measurement frequency $f_{Puls}$, a return jump is brought about for setting the measurement frequency, that is to say a renewed execution of the interference frequency analysis is brought about.

Preferably, after the determining of the voltage $U_{Ze}$, a threshold value query $U_{Ze}<U_{Ze\_max}$ is carried out, whereby $U_{Ze\_max}$ corresponds to a measurement range threshold value of the signal generator and the method is continued with a return jump to setting the measurement frequency $f_{Puls}$, in the event that $U_{Ze}>U_{Ze\_max}$.

This threshold value query is used for the detection of further external interference sources at the measurement frequency $f_{Puls}$ connected in series, which would lead to a distortion of the voltage drop $U_{Ze}$ required for calculating the leakage impedance $Z_E$. If the voltage $U_{Ze}$ determined exceeds a predetermined measurement range threshold value, then the method is likewise continued with a return jump to setting the measurement frequency, that is to say a search is made in accordance with the interference frequency analysis for a measurement frequency which is less susceptible to interference and, if necessary, a switch is made to this measurement frequency.

In a preferred configuration, the determining of the voltage $U_{Ze}$ takes place across the measurement resistance $R_M$ with applied measurement voltage $U_P$ by means of the measurement of the line-to-line voltages $U_{L-E}$, addition of the measured line-to-line voltages $U_{L-E}$ and subsequent band-pass filtering of the aggregate signal for obtaining a voltage component giving the voltage $U_{Ze}$ at the frequency $f_{Puls}$.

Starting from the individual line-to-line voltages $U_{L-E}$ already measured for determining the maximum occurring line-to-line voltage $U_{L-Emax}$, these are initially supplied to an adder. The addition of the line-to-line/partial voltages $U_{L-E}$ in this case corresponds to the parallel connection of the coupling branches, so that the (filtered) aggregate signal can be drawn upon as the actual measurement signal for determining the leakage impedance. The subsequent band-pass filtering of the aggregate signal using the measurement frequency $f_{Puls}$ as centre frequency $f_{G\_BP}$ of the band-pass filter produces the desired (measurement) signal component $U_{Ze}$.

In this case, the centre frequency of the band-pass filter for filtering out the voltage $U_{Ze}$ is automatically set to the measurement frequency $f_{Puls}$ of the signal generator. This is advantageous, as the band-pass filter centre frequency $f_{G\_BP}$-$f_{Puls}$ is already available as the result of the interference frequency analysis.

The calculation of the leakage impedance $Z_E$ takes place in accordance with the relationship $Z_E=(U_P*R_M)/U_{ZE}-(R_M+R_A)$. Advantageously, the leakage impedance $Z_E$ can therefore be expressed as a function of the known values $U_P$, $R_M$ and $R_A$, as well as the determined value $U_{Ze}$.

The subsequent determination of the maximum leakage current THC takes place in accordance with the formula THC=$U_{L-Emax}/Z_{E0}$, $Z_{E0}$ being the leakage impedance at the network frequency, which arises in a frequency-corrected manner from the value $Z_E$ calculated at the measurement frequency $f_{Puls}$. As the value of the leakage current at the network frequency is definitive, but the value of the leakage impedance was determined at a measurement frequency $f_{Puls}$ deviating from the network frequency, the value of the leakage impedance at the network frequency is to be used for the determining of the leakage current. This can be attained in the case of known modelling of the leakage impedance as parallel connection of an ohmic and a capacitive component from the leakage impedance at the measurement frequency $f_{Puls}$.

In a further preferred configuration, an initialisation and a self test is carried out at the start of the method. In these method steps, a calibration and a test of measurement-relevant parameters takes place, in order to counteract possibly occurring environmental effects and particularly temperature influences.

Expediently, after the initialisation a timer can be started in connection with the self test with the function of restarting the method running repeatedly with a self test, as soon as the timer has run out or to continue with the renewed measurement of the line-to-line voltages in the case of a timer which has not yet run out.

Preferably, the measurement signal $U_P$ is generated with a pulse generator from a rectangular signal characteristic. The generation of a rectangular signal characteristic in connection with a subsequent filtering for generating a desired sinusoidal signal component constitutes a cost-effective option for signal generation.

The object according to the invention is also achieved with the characteristics of a device for determining a maximum leakage current in unearthed power supply networks (2) with a plurality of live conductors (L1, L2) according to a thirteenth embodiment of the invention in that the device consists of the a signal generator (10) for feeding in a measurement signal $U_P$ with a measurement frequency $f_{Puls}$, a network coupling circuit (12) between signal generator (10) and conductor arrangement (2), a voltage measuring circuit (14) for measuring the line-to-line voltages $U_{L-E}$, an impedance measuring circuit (16) for determining the leakage impedance $Z_e$ by means of the determining of a voltage $U_{Ze}$, wherein the voltage measuring circuit (14) is connected at the input-side to the network coupling circuit (12) and at the output-side via analogue/digital converter (24) to an arithmetic unit (18) for digital signal processing, which arithmetic unit has a storage unit (34) and also controls a display unit (42) and a digital interface (40), characterised in that for setting the measurement frequency $f_{Puls}$ of the signal generator (10), a signal generator control apparatus (36), by means of which the measurement frequency $f_{Puls}$ can be changed during the measurement, is connected to the signal generator (10). Additional, particularly beneficial, embodiments of the invention are provided in accordance with the following subsidiary devices for determining a maximum leakage current in unearthed power supply networks (2) with a plurality of live conductors (L1, L2).

In accordance with a fourteenth device of determining a maximum leakage current embodiment of the invention, the thirteenth embodiment is modified so that for each conductor, the network coupling circuit (12) has coupling resistances $R_A$ and, for picking up of the line-to-line voltages $U_{L-E}$, measurement resistances $R_M$, which are arranged in series connection with the signal generator (10) and the respective conductor (L1, L2). In accordance with a fifteenth device of determining a maximum leakage current embodiment of the invention, the thirteenth embodiment or the fourteenth embodiment is modified so that at the input side, the voltage measuring circuit (14) detects a voltage $U_{L-E}$ for every conductor (L1, L2) across the measurement resistance $R_M$ and has an amplification circuit (21, 22), as well as a difference amplifier (26) for every conductor pair n, m for determining the differential voltage $U_{Lnm}$, and at the output side forwards the measured line-to-line voltages $U_{L-E}$ and also the differential voltage $U_{Lnm}$ to the analogue/digital converter. In accordance with a sixteenth device of determining a maximum leakage current embodiment of the invention, the thirteenth embodiment, the fourteenth embodiment, or the fifteenth embodiment is modified so that the impedance measuring circuit (16) has an adder (28), to which the line-to-line voltages $U_{L-E}$ provided by the voltage measuring circuit (14) are supplied and has a band-pass filter for filtering out the voltage $U_{Ze}$ from the aggregate signal of the adder (28), the centre frequency $f_{G\_BP}$ of which band-pass filter (30) can be set by means of a control input, the filtered signal subsequently passing through an amplifier (32), before it is forwarded to the analogue/digital converter (24) of the arithmetic unit (18). In accordance with a seventeenth device of determining a maximum leakage current embodiment of the invention, the sixteenth embodiment is modified so that the device is characterised by a band-pass filter control apparatus (36) for setting the centre frequency $f_{G\_BP}$ of the band-pass filter (30). In accordance with a eighteenth device of determining a maximum leakage current embodiment of the invention, the thirteenth embodiment, the fourteenth embodiment, the fifteenth embodiment, sixteenth embodiment, or the seventeenth embodiment is modified so that the analogue/digital converter (24), the signal generator control apparatus (36) and the band pass filter control apparatus (38) are integrated into the arithmetic unit (18) in each case.

The realisation of the fundamental idea according to the invention, namely to draw on a measurement frequency which is as interference-free as possible for determining the maximum leakage current THC and to determine this measurement frequency automatically, preferably consists in providing a signal generator control apparatus for setting the measurement frequency. The signal generator control apparatus constitutes a functional interface between signal generator and arithmetic unit and can preferably be a constituent of the arithmetic unit. The measurement frequency $f_{Puls}$ of the measurement signal $U_P$ which the signal generator outputs can be changed during the measurement and in particular during the interference frequency analysis by means of the signal generator control apparatus. The arithmetic unit itself in this case executes the overwhelming part of the digital signal processing.

For each conductor, the network coupling circuit has coupling resistances $R_A$ and, for detecting the line-to-line voltages $U_{L-E}$, measurement resistances $R_M$, which are arranged in series connection with the signal generator and the respective conductor. This configuration of the network coupling allows the pick up of the line-to-line voltages $U_{L-E}$ including the voltage $U_{Ze}$ required for determining the leakage impedance $Z_E$.

In a further expedient configuration, the voltage measuring circuit is realised in such a manner that at the input side, this detects a voltage $U_{L-E}$ for every conductor across the measurement resistance $R_M$ and has an amplification circuit, as well as a difference amplifier for every conductor pair n, m for determining the differential voltage $U_{Lnm}$, and at the output side forwards the measured line-to-line voltages $U_{L-E}$ and also the differential voltages $U_{Lnm}$ to the analogue/digital converter.

The voltage measuring circuit is the link between the network coupling circuit, which enables physical access to the voltages, and the arithmetic unit, which by means of the analogue to digital converter records the line-to-line voltages $U_{L-E}$ detected in this manner for digital processing. The differential voltages $U_{Lnm}$ between two conductors n, m supplied to the arithmetic unit likewise via the digital/analogue converter furthermore enable the detection of an interference voltage caused by a connected consumer.

It also proves to be an advantage that the impedance measuring circuit has an adder, to which the line-to-line voltages $U_{L-E}$ provided by the voltage measuring circuit are supplied and has a band-pass filter for filtering out the voltage $U_{Ze}$ from the aggregate signal of the adder, the centre frequency $f_{G\_BP}$ of which band-pass filter can be set by means of a control input, the filtered signal subsequently passing through an amplifier, before it is forwarded to the analogue/digital converter of the arithmetic unit.

The impedance measuring circuit provides the voltage $U_{Ze}$ required for calculating the leakage impedance $Z_E$, which voltage results due to the applied measurement voltage $U_P$ across the measurement resistances $R_M$. To this end, the impedance measuring circuit comprises an adder for summing the line-to-line voltages $U_{L-E}$ provided by the voltage measuring circuit. The aggregate signal of the adder is subsequently subjected to a band-pass filtering with the measurement frequency $f_{Puls}$ as centre frequency $f_{G\_BP}$ of the band-pass filter and a further amplification, in order to obtain the desired (measurement) signal component $U_{Ze}$.

The band-pass filter control apparatus proves particularly advantageous for setting the centre frequency of the band-pass filter, by means of which the selected measurement frequency $f_{Puls}$ can be supplied to the band-pass filter as centre frequency $f_{G\_BP}$ synchronously to the signal generator control apparatus.

Preferably, the analogue/digital converter, the signal generator control apparatus and the band pass filter control apparatus are integrated into the arithmetic unit in each case. In this case, the analogue/digital converter is realised as distinct physical units, the signal generator control apparatus and the band-pass filter control apparatus by contrast constitute functional units of the arithmetic unit.

BRIEF DESCRIPTION OF THE DRAWINGS

Further configuration features result from the following description and the drawings which explain a preferred embodiment of the invention with reference to examples. In the figures.

DETAILED DESCRIPTION OF THE INVENTION

In the following, the background of the invention including the relevant circuit values is initially presented in FIGS. 1 to 3, starting from an embodiment of the device according to the invention. The FIGS. 4 and 5 relate to an embodiment of the method according to the invention.

Figure 1:
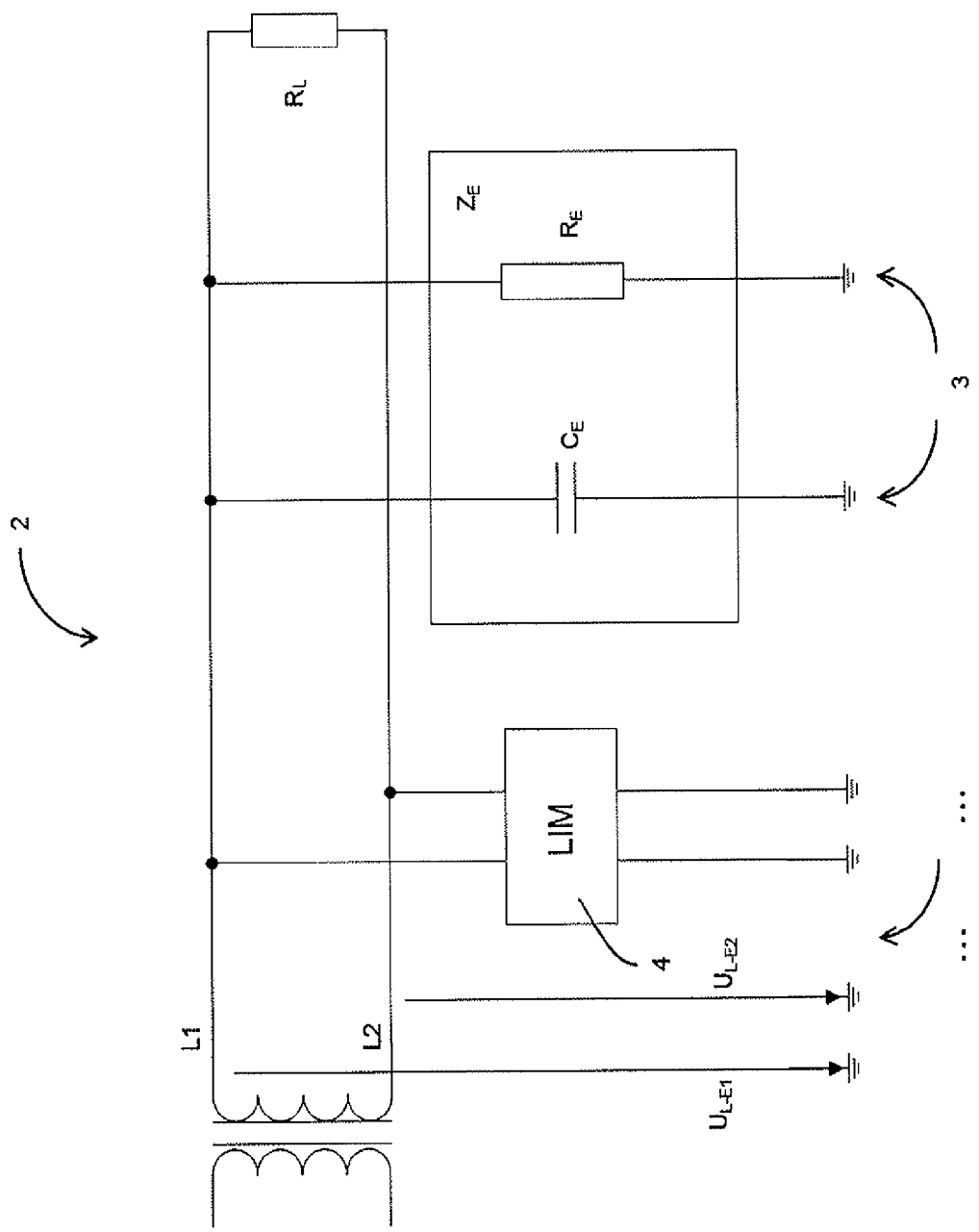
FIG. 1: shows a block diagram of an unearthed power supply network with leakage impedance and monitoring device.

FIG. 1 shows a block diagram of an unearthed power supply network 2 with two active conductors L1, L2, as is used everywhere where operational safety and personal protection is a priority. For example, mains of this type for energy supplying of medical devices, shown by means of the load $R_L$, could be used in hospitals. Neither of the two active conductors L1 and L2 is connected to the earthed potential 3 (the impedance $Z_E$ may initially be ignored), so that a closed current path does not arise in the case of the touching of a conductor by an (earthed) person. On the one hand, the person is protected from unacceptably high body currents by means of this arrangement, so that personal protection is ensured, on the other hand an upstream fuse does not respond in the case of such a unipolar earth fault and the network can be operated further in spite of the body connection, as a result of which the operative and supply reliability is also provided. However, towards the earth 3, a conductor arrangement of this type has an admittedly in reality very large, but nonetheless finite ohmic resistance $R_E$ and forms a capacitance $C_E$ with respect to the earth 3. Thus, a complex resistance results as leakage impedance $Z_E$, by means of which, in the case of an earth fault due to a person touching a conductor, a closed current path is formed and can lead to dangerous body currents. For this reason, the mains is equipped with a monitoring device 4 (also designated as Line Isolation Monitor—LIM), which constantly determines the maximum current which would flow in the event that a person would touch a live conductor (leakage current THC). As the leakage current results from the division of the maximum occurring line-to-line voltage $U_{L-Emax}=\max(U_L\text{-}E_1, U_{L-E2})$ by the leakage impedance $Z_E$ in accordance with $THC=U_{L-Emax}/Z_{E0}$ ($Z_{E0}$ is the leakage impedance at the network frequency), in addition to the measurement of the line-to-line voltages $U_{L-E1}$, $U_{L-E2}$, a determination of the leakage impedance $Z_E$ must be carried out in the monitoring device 4 for determining the leakage current.

Figure 2:
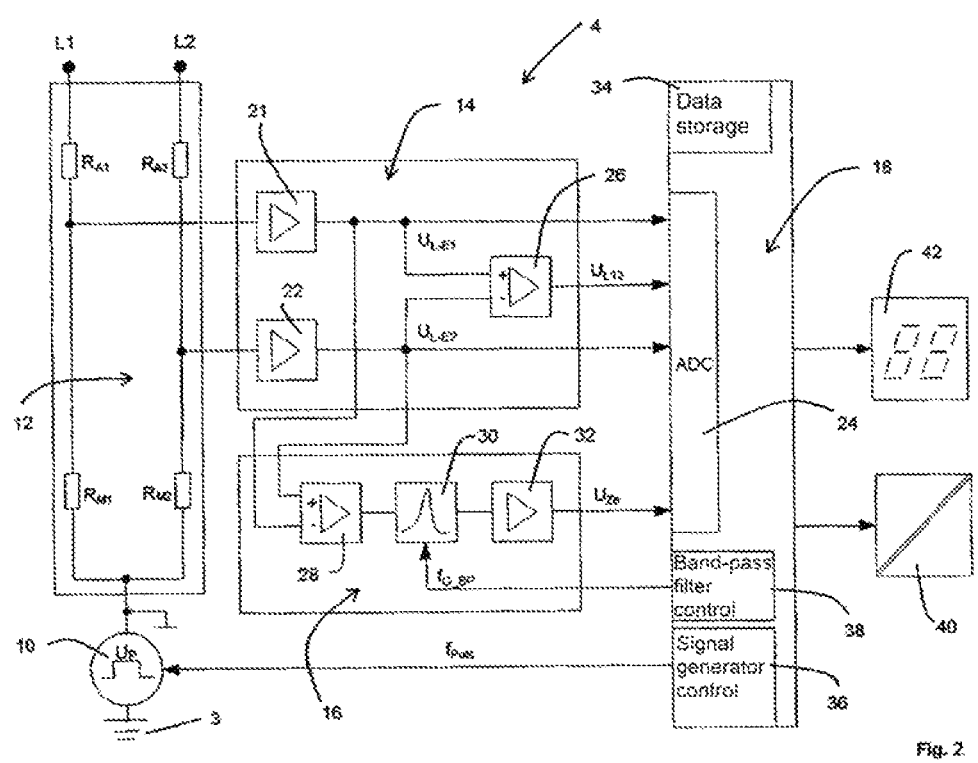
FIG. 2: shows a block diagram of a device according to the invention for determining a maximum leakage current.

FIG. 2 shows the construction of a device 4 for determining the leakage current according to the invention. The device 4 consists of a signal generator 10, a network coupling circuit 12, a voltage measuring circuit 14, an impedance measuring circuit 16 and an arithmetic unit 18.

The signal generator 10 is at earth potential 3 on one side and feeds a measurement signal $U_P$, which contains the measurement frequency $f_{Puls}$, into the wiring network L1, L2 via the network coupling circuit 12.

The network coupling circuit 12 consists for every conductor L1, L2 of a coupling branch, which in each case has a coupling resistance $R_{A1}$, $R_{A2}$ and, for the picking up of the line-to-line voltages $U_{L-E1}$, $U_{L-E2}$, a measurement resistance $R_{M1}$, $R_{M2}$ and is arranged in series connection with the signal generator and the respective conductor.

The voltage measuring circuit 14 taps off the line-to-line voltages $U_{L-E1}$ and $U_{L-E2}$ by means of the measurement resistances $R_{M1}$ and $R_{M2}$ and forwards them in each case via an amplification circuit 21, 22 to the analogue/digital converter 24 and also to the impedance measuring circuit 16. The voltage measuring circuit 14 furthermore has a difference amplifier 26 for determining a differential voltage $U_{L12}$ from the two line-to-line voltages $U_{L-E1}$ and $U_{L-E2}$, which is likewise forwarded to an analogue/digital converter 24.

In the impedance measuring circuit 16, the two line-to-line voltages $U_{L-E1}$ and $U_{L-E2}$ are initially combined in an adder 28, in order to detect both currents flowing in the parallel circuit of the conductor-based coupling branches or the voltages resulting therefrom. Subsequently, the aggregate signal passes through a band-pass filter 30, which filters out the signal components at the measurement frequency $f_{Puls}$. The centre frequency of the band-pass filter $f_{G\_BP}$ is to this end set to the measurement signal frequency $f_{Puls}$ of the signal generator 10. Thus, only the signal components which were generated by the signal generator 10 itself at the measurement frequency $f_{Puls}$ are taken into account. The output signal $U_{Ze}$ of the band-pass filter 30 carried via an amplifier 32 therefore constitutes the actual signal for the calculation of the leakage impedance $Z_E$.

The determination of a suitable measurement frequency $f_{Puls}$ which is as interference-free as possible takes place completely automatically according to the invention. The digital signal processing of the signals received via the analogue/digital converter 24, including data storage 34, takes place in the arithmetic unit 18. In the present exemplary embodiment, the analogue/digital converter 24, a signal generator control apparatus 36 and a band-pass filter control apparatus 38 are integrated into the arithmetic unit 18. The signal generator control apparatus 36 forwards the measurement frequency $f_{Puls}$ determined in the arithmetic unit as a result of the interference frequency analysis to the signal generator 10. Synchronously to that, the band-pass filter control apparatus 38 controls the centre frequency $f_{G\_BP}$ of the band-pass filter 30, in order, as explained above, to extract the relevant signal components in the impedance measuring circuit 16 or in order, during the interference frequency analysis, to tune the band-pass filter 30 over the measurement frequency range, with the measurement frequency $U_P$ switched off. The band-pass filter control apparatus 38 can also be realised in such a manner that, given a corresponding configuration of the band-pass filter 30, instead of a direct control with the frequency signal $f_{Puls}$, a control by means of a pulse-width modulated (PWM) signal takes place.

A digital interface 40 and also an optical display 42 of the determined maximum leakage current or also acoustic warning apparatuses (not shown here) in the event of exceeding of the maximum acceptable leakage current are provided as further interfaces.

Figure 3:
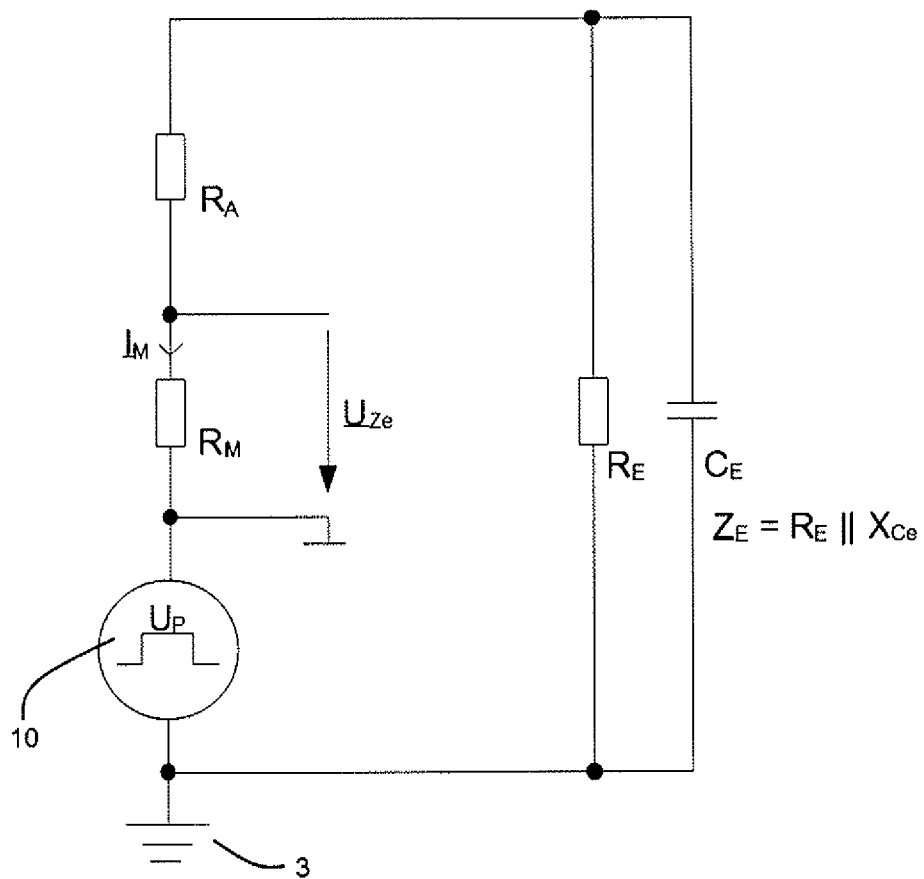
FIG. 3: shows a simplified equivalent circuit diagram for determining the leakage impedance.

FIG. 3 clarifies the determination of the leakage impedance $Z_E$ in a simplified equivalent circuit diagram. In this case, the measurement resistances $R_{M1}$ and $R_{M2}$ and also the coupling resistances $R_{A1}$ and $R_{A2}$ are in each case combined to form a resistance $R_M$ and $R_A$. The line-to-line voltages $U_{L\text{-}E1}$ and $U_{L\text{-}E2}$ have no influence, as they cannot pass the band-pass filter 30. The leakage impedance $Z_E$ results at the measurement frequency $f_{Puls}$ as a complex resistance from the parallel connection of the ohmic component $R_E$ and the reactance $j*2*\pi*f_{Puls}*C_E$ and can be expressed as a function of the known values $U_P$, $R_M$ and $R_A$ and also the determined or measured value $U_{Ze}$ as $Z_E=(U_P*R_M)/U_{Ze}-(R_M+R_A)$. From this, the ohmic resistance $R_E$ and the capacitance $C_E$ can be determined, from which the desired leakage impedance $Z_{E0}$ at the network frequency can then be derived.

Figure 4:
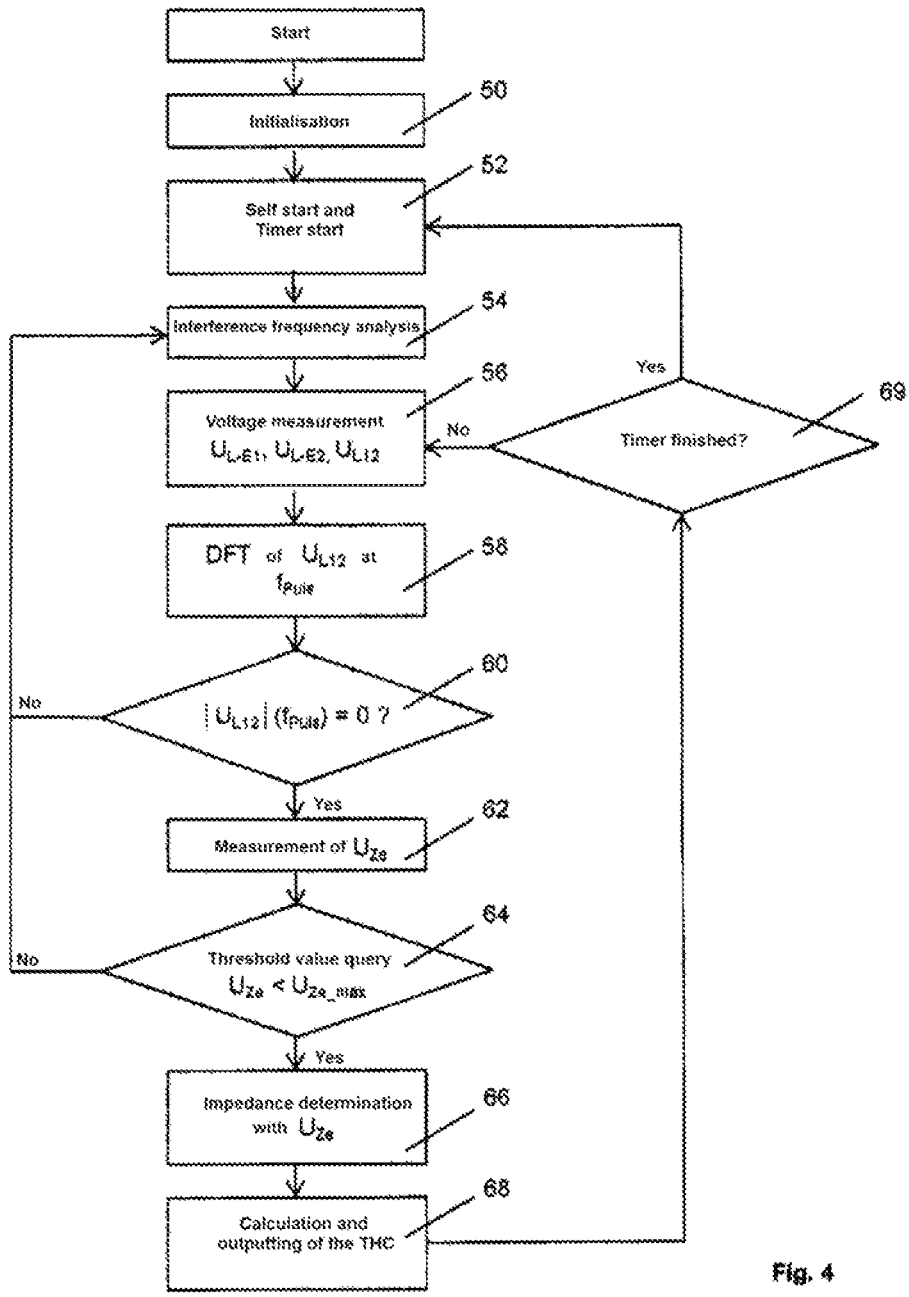
FIG. 4: shows a flow chart of a method according to the invention for determining a maximum leakage current

A flow chart of the method according to the invention for determining a maximum leakage current for the unearthed power supply network 2 shown in FIG. 1 with two active conductors L1 and L2 is reproduced in FIG. 4.

The method begins after the start in step 50 with the initialisation of the system and carries out a self test in step 52. Here, important measurement-relevant parameters are tested and calibrated, in order to counteract possibly occurring environmental effects and particularly temperature influences. In addition, a timer (in combination with step 69) can be set, following the running out of which, the course of the method, which is constantly repeating in a loop, is continued with a self test at step 52.

Figure 5:
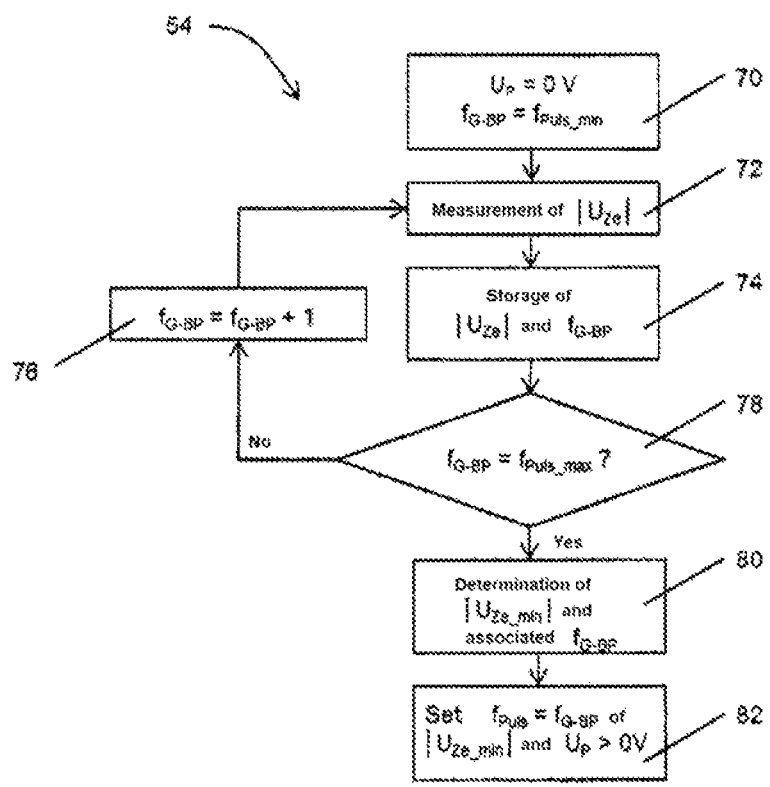
FIG. 5: shows a flow chart of an interference frequency analysis.

After the self test, in step 54 an interference frequency analysis, executed by the arithmetic unit 18, which delivers a measurement frequency $f_{Puls}$ at which the interference pulses are minimal as a result, follows; see FIG. 5 to this end. At this measurement frequency $f_{Puls}$, the signal generator 10 is set by the arithmetic unit 18 via the signal generator control apparatus 36 and the band-pass filter 30 is set by the arithmetic unit via the band-pass filter control apparatus 38 is set by the arithmetic unit.

In step 56, the measurement of the two line-to-line voltages $U_{L\text{-}E1}$ and $U_{L\text{-}E2}$ and, derived therefrom, the determination of the differential voltage $U_{L12}$ and also the determination of the maximum occurring line-to-line voltage $U_{LEmax}$. Whilst the maximum occurring line-to-line voltage $U_{LEmax}$ is integrated directly into the determination of the maximum leakage current (see step 68), the differential voltage $U_{L12}$ is used during ongoing measurement at the position of the measurement frequency $f_{Puls}$ to detect an interference frequency component which is caused by a connected consumer. The measurement voltage $U_P$ itself cannot be determined in the determined differential voltage $U_{L12}$, as the measurement current driven by the signal generator 10 flows in equal parts through the measurement resistances $R_{M1}$ and $R_{M2}$ into the coupling branches of the network coupling circuit 12 and the components are mutually compensated by subtraction 26. A possible interference amplitude at the place of the measurement frequency $f_{Puls}$ can be discovered by means of a discrete Fourier transformation (DFT) of the temporal progression of the differential voltage $U_{L12}$ (step 58). If an interference of this type is detected, according to step 60, $|U_{L12}|(f_{Puls})>0$ is therefore true, so the method is continued with a return jump to setting the measurement frequency, that is to say with renewed execution of the interference frequency analysis. If no interference of this type can be determined, $|U_{L12}|(f_{Puls})=0$ is therefore true, so in step 62, the voltage $U_{Ze}$ is determined for calculating the leakage impedance $Z_E$. Before the voltage $U_{Ze}$ for impedance determination is drawn on in step 66, a threshold value query takes place in step 64. By means of the test, whether the determined voltage $U_{Ze}$ is smaller than a predetermined maximum measurement range threshold value $U_{Ze\_max}$ of the signal generator 10, further external interference sources, which would lead to distortion of the voltage drop $U_{Ze}$ required for calculating the leakage impedance $Z_E$, connected in series at the measurement frequency $f_{Puls}$ are detected. The method is continued with a return jump to setting the measurement frequency $f_{Puls}$, that is to say in turn with a renewed execution of the interference frequency analysis, in the event that $U_{Ze}>U_{Ze\_max}$. If the determined voltage $U_{Ze}$ lies below the threshold value $U_{Ze\_max}$, then in step 66, the leakage impedance $Z_E$ (at the measurement frequency $f_{Puls}$) is calculated and $Z_{E0}$ at the network frequency is derived therefrom according to FIG. 3. A measurement cycle is completed in step 68 with the calculation and the outputting of the maximum leakage current $THC=U_{L\text{-}Emax}/Z_{E0}$. If the previously set timer has not yet run out, then a renewed run-through of the method according to the invention is continued in step 56 with the voltage measurement; if the timer has run out, a return jump to step 52 is carried out and beforehand a renewed self test is carried out (step 69).

FIG. 5 shows a flow chart of the interference frequency analysis in a detailed manner. The interference frequency analysis is executed in accordance with step 54 in FIG. 4 at the start of the method. It is also possible to jump back to the interference frequency analysis during the course of the method, however, in the event that interference components arise during the measurement at the measurement frequency $f_{Puls}$ (cf. the queries in the steps 60 and 64 in FIG. 4). In the interference frequency analysis, a search is made for any interference frequencies present by means of a band-pass filter 30 with changeable centre frequency $f_{G\_BP}$ within the settable frequency range of the signal generator 10 and the frequency at which the interference amplitudes are minimal is selected as measurement frequency $f_{Puls}$.

At the start of the interference frequency analysis, the measurement signal $U_P$ is set to zero in step 70, in order to detect external interference signals exclusively. The lower threshold frequency of the settable frequency range $f_{Puls\_min}$ is chosen as start value for the centre frequency $f_{G\_BP}$ of the band-pass filter 30. Subsequently, the measurement of the voltage $U_{Ze}$ and the formation of the absolute value $|U_{Ze}|$ takes place for this pass range of the band-pass filter 30 in step 72. In step 74, this value is stored together with the associated frequency value $f_{G\_BP}$. The measurement and storage is carried out repeatedly with the step-by-step increase (step 76) of the centre frequency $f_{G\_BP}$ of the band-pass filter, until, in accordance with the branch in step 78, the centre frequency $f_{G\_BP}$ of the band-pass filter 30 reaches the upper threshold frequency of the settable frequency range $f_{Puls\_max}$. Then, in step 80, the minimum $|U_{Ze\_min}|$ is selected from the measured voltages $|U_{Ze}|$ and, in step 82, the frequency belonging to this value is set as measurement frequency $f_{Puls}$, and also the measurement signal $U_P$ is turned on again.

The invention claimed is:

1. A method for determining a maximum leakage current in unearthed power supply networks with a plurality of live conductors, wherein the method comprises the steps of:
   (a) feeding a measurement signal $U_P$ with a measurement frequency $f_{Puls}$ into a conductor arrangement formed in the unearthed power supply networks;
   (b) setting the measurement frequency $f_{Puls}$;
   (c) measuring a line-to-line voltage $U_{L-E}$ for each conductor of the plurality of live conductors;
   (d) determining a maximum occurring line-to-line voltage $U_{L-Emax}$ from the plurality of measured line-to-line voltages $U_{L-E}$ obtained by measurement in step (c);
   (e) determining a voltage $U_{Ze}$ across a measurement resistance $R_M$ taking into account the measured line-to-line voltages $U_{L-E}$ for each conductor of the plurality of live conductors;
   (f) calculating a leakage impedance $Z_E$ using the voltage $U_{Ze}$ determined in step (e) across the measurement resistance $R_M$;
   (g) calculating a maximum leakage current THC using the calculated leakage impedance $Z_E$ and using the maximum occurring line-to-line voltage $U_{L-Emax}$; and
   (h) repeating the previous steps (a) thru (g),
   wherein the measurement frequency $f_{Puls}$ is changeable during the measurement of step (c), and the setting of the measurement frequency $f_{Puls}$ in step (b) takes place automatically by means of an interference frequency analysis.

2. The method according to claim 1, wherein the interference frequency analysis comprises a method including the following automatically running steps of
   i. setting of the measurement signal value $U_P=0$ volt;
   ii. setting of a centre frequency $f_{G\_BP}$ of a band-pass filter to a lower threshold frequency $f_{Puls\_min}$ of a measurement range of a signal generator;
   iii. determining the absolute value $|U_{Ze}|$ of the voltage $U_{Ze}$ across the measurement resistance $R_M$;
   iv. storing the absolute value $|U_{Ze}|$ and the associated frequency $f_{G\_BP}$ set;
   v. repeating the determination of the absolute value $|U_{Ze}|$ of the voltage $U_{Ze}$ with step-by-step increasing of the centre frequency $f_{G\_BP}$ of the band-pass filter, until $f_{G\_BP}$ corresponds to an upper threshold frequency $f_{Puls\_max}$ of a measurement range of a signal generator;
   vi. determining a smallest measurement value $|U_{Ze}|$ min from the voltages recorded $|U_{Ze}|$ and determining the associated centre frequency $f_{G\_BP}$; and
   vii. setting of the measurement frequency $f_{Puls}$ to the value $f_{G\_BP}$ belonging to the measurement value $|U_{Ze}|$ min and setting the measurement signal value to $U_P>0$ volt.

3. The method according to claim 1, wherein differential voltages $U_{Lnm}$ between conductor pairs n, m are determined from the measurement of the line-to-line voltages $U_{L-E}$, following that, respective spectral components of these differential voltages $U_{Lnm}$ at the point $f_{Puls}$ are calculated and the method is continued with a return jump to setting the measurement frequency $f_{Puls}$, in the event that $|U_{Lnm}|(f_{Puls})>0$ is true for one of the differential voltages $U_{Lnm}$.

4. The method according to claim 2, wherein after the step (e) of determining the voltage $U_{Ze}$, a threshold value query $U_{Ze}<U_{Ze\_max}$ is carried out, wherein $U_{Ze\_max}$ corresponds to a measurement range threshold value of the signal generator and the method is continued with a return jump to setting the measurement frequency $f_{Puls}$, in the event that $U^{Ze}>U_{Ze\_max}$.

5. The method according to claim 1, wherein determination of the voltage $U_{Ze}$ takes place across the measurement resistance $R_M$ with applied measurement voltage $U_P$ by means of the measurement of the line-to-line voltages $U_{L-E}$, addition of the measured line-to-line voltages $U_{L-E}$ and subsequent band-pass filtering of the aggregate signal for obtaining a voltage component giving the voltage $U_{Ze}$ at the frequency $f_{Puls}$.

6. The method according to claim 2, wherein the centre frequency $f_{G\_BP}$ of the band-pass filter for filtering out the voltage $U_{Ze}$ is automatically set to the measurement frequency $f_{Puls}$ of the signal generator.

7. The method according to claim 1, wherein the step (f) of calculating the leakage impedance $Z_E$ takes place in accordance with the relationship $Z_E=(U_P*R_M)/U_{ZE}-(R_M+R_A)$.

8. The method according to claim 1, wherein the step (g) of calculating the maximum leakage current THC takes place in accordance with the formula $THC=U_{L-Emax}/Z_{E0}$, wherein $Z_{E0}$ is the leakage impedance at the network frequency that arises in a frequency-corrected manner from the value $Z_E$ calculated at the measurement frequency $f_{Puls}$.

9. The method according to claim 1, wherein an initialisation is carried out at the start of the method.

10. The method according to claim 1, wherein a self test is carried out at the start of the method.

11. The method according to claim 9, wherein after the initialisation a timer is started, and the method begins again with a self test when the timer has run out or the measurement of the line-to-line voltages in step (c) is constantly continued when the timer has not run out.

12. The method according to claim 1, wherein the measurement signal $U_P$ is generated with a signal generator from a rectangular signal characteristic.

13. A method for determining a maximum leakage current in unearthed power supply networks with a plurality of live conductors, wherein the method comprises the steps of:
   (a) feeding a measurement signal $U_P$ with a measurement frequency $f_{Puls}$ into a conductor arrangement formed in the unearthed power supply networks;
   (b) setting the measurement frequency $f_{Puls}$;
   (c) measuring a line-to-line voltage $U_{L-E}$ for each conductor of the plurality of live conductors;
   (d) determining a maximum occurring line-to-line voltage $U_{L-Emax}$ from the plurality of measured line-to-line voltages $U_{L-E}$ obtained by measurement in step (c);
   (e) determining a voltage $U_{Ze}$ across a measurement resistance $R_M$ taking into account the measured line-to-line voltages $U_{L-E}$ for each conductor of the plurality of live conductors;
   (f) calculating a leakage impedance $Z_E$ using the voltage $U_{Ze}$ determined in step (e) across the measurement resistance $R_M$;
   (g) calculating a maximum leakage current THC using the calculated leakage impedance $Z_E$ and using the maximum occurring line-to-line voltage $U_{L-Emax}$; and
   (h) repeating the previous steps (a) thru (g),
   wherein the measurement frequency $f_{Puls}$ is changeable during the measurement of step (c), and the setting of the measurement frequency $f_{Puls}$ in step (b) takes place automatically by means of an interference frequency analysis, wherein the step (g) of calculating the maximum leakage current THC takes place in accordance with the formula $THC = U_{L-Emax}/Z_{E0}$, wherein $Z_{E0}$ is the leakage impedance at the network frequency that arises in a frequency-corrected manner from the value $Z_E$ calculated at the measurement frequency $f_{Puls}$, and wherein an initialisation is carried out at the start of the method and after the initialisation a timer is started, and the method begins again with a self test when the timer has run out or the measurement of the line-to-line voltages in step (c) is constantly continued when the timer has not run out.

* * * * *